United States Patent
Kaza et al.

(10) Patent No.: US 11,112,430 B2
(45) Date of Patent: Sep. 7, 2021

(54) PROBE HEAD AND ELECTRONIC DEVICE TESTING SYSTEM

(71) Applicant: Intel Corporation, Santa Clara, CA (US)

(72) Inventors: Anil Kaza, Hillsboro, OR (US); Donald E. Edenfeld, Beaverton, OR (US); Todd P. Albertson, Warren, OR (US); Patrick Whiting, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 16/366,197

(22) Filed: Mar. 27, 2019

(65) Prior Publication Data

US 2020/0309818 A1  Oct. 1, 2020

(51) Int. Cl.
*G01R 3/00* (2006.01)
*G01R 1/073* (2006.01)
*G01R 1/067* (2006.01)

(52) U.S. Cl.
CPC ..... *G01R 1/07314* (2013.01); *G01R 1/06705* (2013.01); *G01R 1/06711* (2013.01)

(58) Field of Classification Search
CPC .......... G01R 31/02; G01R 3/00; G01R 1/073; G01R 1/07314; G01R 1/06705; G01R 1/06711
See application file for complete search history.

(56) References Cited

U.S. PATENT DOCUMENTS

| | | | |
|---|---|---|---|
| 4,662,975 A * | 5/1987 | Dufresne | G01N 17/00 156/345.15 |
| 2013/0142491 A1* | 6/2013 | Ruzzier | G02B 6/4401 385/100 |
| 2014/0176172 A1* | 6/2014 | Stevenson | G01R 1/06755 324/754.03 |
| 2015/0168455 A1* | 6/2015 | Anraku | C22C 5/04 324/754.03 |
| 2015/0280344 A1* | 10/2015 | Henry | G01R 1/06722 439/700 |
| 2017/0276700 A1* | 9/2017 | Stanford | G01R 3/00 |

* cited by examiner

*Primary Examiner* — Jermele M Hollington
*Assistant Examiner* — Taqi R Nasir
(74) *Attorney, Agent, or Firm* — Schwegman Lundberg & Woessner, P.A.

(57) ABSTRACT

A probe head may be utilized to test an electronic device. The probe head may include a probe axis extending along a length of the probe head. The probe head may include a probe core including a first metal. The probe core may include a core surface having a first dimension. The first dimension may be perpendicular to the probe axis. The probe core may include a probe tip, for instance extending from the core surface along the probe axis. The probe tip has a second dimension that may be perpendicular to the probe axis. The second dimension may be less than the first dimension of the core surface. The probe head may include a cladding layer that includes a second metal. The cladding layer may be coupled around a perimeter of the probe core. The probe tip may extend beyond the cladding layer.

20 Claims, 7 Drawing Sheets

1100

```
┌─────────────────────────────────┐
│ ETCHING A CLADDING LAYER OF A   │
│ PROBE HEAD WITH A FIRST ETCHANT │
│ TO REMOVE A PORTION OF THE      │─── 1110
│ CLADDING LAYER FROM A PROBE     │
│ CORE OF THE PROBE HEAD, WHEREIN │
│ THE CLADDING LAYER INCLUDES A   │
│ FIRST METAL;                    │
└─────────────────────────────────┘
                 │
┌─────────────────────────────────┐
│ ETCHING THE PROBE CORE WITH A   │
│ SECOND ETCHANT TO REMOVE A      │
│ PORTION OF THE PROBE CORE,      │
│ WHEREIN THE PROBE CORE INCLUDES │─── 1120
│ A SECOND METAL; AND WHEREIN THE │
│ CLADDING LAYER EXTENDS BEYOND A │
│ PROBE CORE SURFACE OF THE       │
│ PROBE CORE.                     │
└─────────────────────────────────┘
```

FIG. 11

PROBE HEAD AND ELECTRONIC DEVICE TESTING SYSTEM

TECHNICAL FIELD

This document pertains generally, but not by way of limitation, to electronic device testing systems, and electronic device testing systems that may include a probe head.

BACKGROUND

An electronic device testing system may test an electronic device (e.g., a die, for instance a silicon die). The electronic device may include a plurality of contacts (e.g., pads, bumps, pillars, or the like). The testing system may include a probe, and a portion of the probe may engage with (e.g., establish physical contact with) the contacts of the electronic device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 11 shows one example of a method for manufacturing an electronic device testing system.

DETAILED DESCRIPTION

Figure 1:
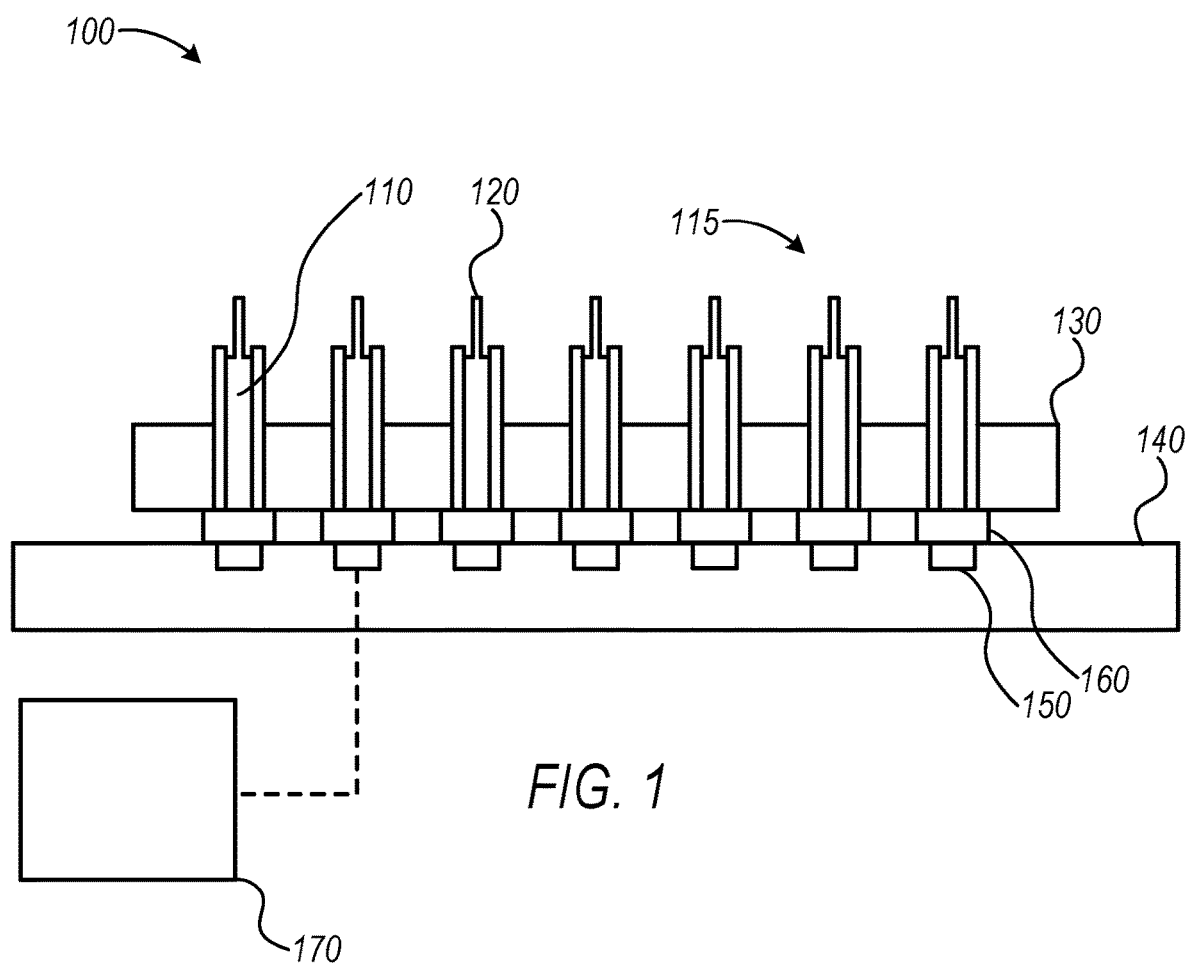
FIG. 1 is a schematic side view of a system 100 for testing electronic devices.

The present inventors have recognized, among other things, that a problem to be solved may include manufacturing a probe head for testing electronic devices, for example a die (e.g., a semiconductor die), memory, processor, package, interposer, motherboard, or the like. Additionally, the present inventors have recognized, among other things, that a problem to be solved may include improving the accuracy and precision of (e.g., reducing the occurrence of defects present in) features of the probe head, for example increasing the accuracy and precision of a probe tip. Further, the present inventors have recognized, among other things, that a problem to be solved may include reducing costs associated with manufacturing the probe head. Still further, the present inventors have recognized, among other things, that a problem to be solved may include reducing costs associated with manufacturing the electronic devices.

The present subject matter may help provide a solution to these problems, such as by providing a probe head for testing electronic devices. The probe head may include a probe axis extending along a length of the probe head. The probe head may include a probe core including a first metal. The probe core may include a core surface having a first dimension. The first dimension may be perpendicular to the probe axis. The probe core may include a probe tip, for instance extending from the core surface along the probe axis. The probe tip has a second dimension that may be perpendicular to the probe axis. The second dimension may be less than the first dimension of the core surface. The probe head may include a cladding layer that includes a second metal. The cladding layer may be coupled around a perimeter of the probe core. The probe tip may extend beyond the cladding layer.

The probe head may engage with the electronic device, and an electrical signal may be generated (e.g., by a signal generator). The signal may be transmitted through the probe head and into the electronic device to test at least one function (e.g., process, operation, or the like) or a component (e.g., a transistor or the like) of the electronic device.

In some examples, the probe tip is manufactured by etching the probe core with a first solvent, and the first solvent does not etch the cladding layer. Accordingly, the probe tip may be manufactured with improved precision and accuracy (e.g., in comparison to trimming the probe tip mechanically, for example with a shear). Improving the precision and accuracy of manufacturing the probe tip may improve the performance of the probe head, for instance by increasing the precision and accuracy of electrical resistance of the probe, a spring constant of the probe head, and/or a shape of the probe tip. Accordingly, variations between individual probe heads may be reduced and performance of the probe head, and the system for testing electronic devices may be improved.

Additionally, the probe head may be manufactured in-situ (e.g., the probe head undergoes at least one manufacturing operation while coupled with other components of the system for testing electronic devices). Manufacturing the probe head in-situ may reduce defects present in the probe head. For example, an individual probe head that has undergone manufacturing operations to fabricate the probe tip may be damaged while being assembled with other components of the system for testing electronic devices. In this example, if the probe head (or the probe tip) is damaged during assembly, the costs associated with manufacturing the system for testing electronic devices may be increase due to the yield losses of the probe head. Manufacturing the probe head in-situ may reduce the occurrence of assembly-related damage, thereby reducing yield losses and reducing costs associated with the system for testing electronic devices, and the costs associated with manufacturing the electronic devices.

This overview is intended to provide an overview of subject matter of the present patent application. It is not intended to provide an exclusive or exhaustive explanation of the invention. The detailed description continues and is included to provide further information about the present patent application.

FIG. 1 is a schematic view of a system 100 for testing electronic devices. In some examples, the electronic device includes a die (e.g., a semiconductor die), memory, processor, package, interposer, motherboard, or the like. The system 100 may include a probe head 110, and the probe head 110 may include a probe tip 120. The probe head 110 (e.g., the probe tip 120) may engage with the electronic device, and the probe head 110 may be in electrical communication with the electronic device. In an example, the probe tip 120 may engage with (e.g., establish physical contact with) a copper bump coupled with a semiconductor die. An electrical signal may be transmitted into the semiconductor die from probe head 110, for instance to test one or more functions of the semiconductor die.

The system 100 may include a probe holder 130 may be sized and shaped to receive the probe head 110. As discussed in greater detail herein, and in some examples, the probe holder 130 is configured to receive a plurality of probe heads 115. The probe holder 130 may separate the probe heads 115 from each other. The probe holder 130 may locate the probe heads 115 in an array. In an example, the probe heads 115 may be arranged in series. In another example, the probe heads 115 may be arranged in a grid.

A substrate 140 may be included in the system 100. The substrate 140 may transmit electrical signals to and from the probe heads 115. For instance, the substrate 140 may include one or more contacts 150, and the probe heads 115 may be coupled to the contacts 150 with solder balls 160. The substrate 140 may include routing traces that are in electrical communication with the contacts 150, and the routing traces may facilitate the transmission of electrical signals to and from the contacts 150 (and the probe heads 115).

The system 100 may include a signal generator 170, and the signal generator 170 may generate an electrical signal to the probe heads 115. In an example, the signal generator 170 may generate a test pattern (e.g., a plurality of varying electrical signals), and the signal generator 170 may transmit (and receive) the test pattern to the probe heads 115 through the substrate 140 (e.g., one or more wires may be coupled between the signal generator 170 and the substrate 140, and the electrical signal is transmitted in the wires). In this example, when the probe heads 115 are engaged with the electronic device, the signal generator 170 may transmit electrical signals to (and receive electrical from) the electronic device to test one or more functions (e.g., a process, operation, or the like) or components (e.g., a transistor or the like) of the electronic device.

Figure 2:
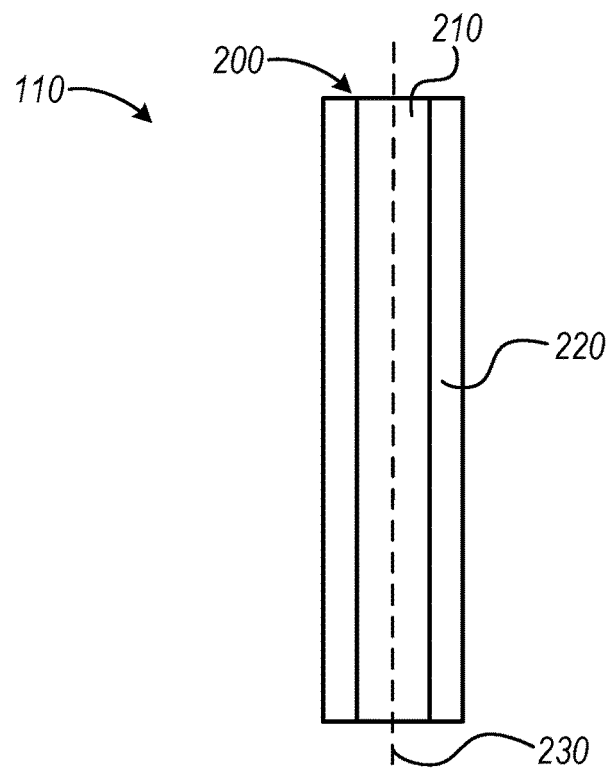
FIG. 2 is a schematic side view of a probe head during a manufacturing operation.

FIG. 2 is a schematic side view of the probe head 110 during a manufacturing operation. The probe head 110 may include a plurality of layers 200. In an example, and as shown in FIG. 2, the probe head 110 may include a core 210, and a cladding layer 220. In another example, the probe head 110 includes additional layers (e.g., another layer coupled to the cladding layer 220). The probe head 110 may include a probe axis 230, and the probe axis 230 may extend along a length of the probe head 110. The probe axis 230 may be located along a center of the probe head 110 (e.g., in the middle of the core 210).

The core 210 may include a first metal (e.g., tungsten or the like). Additionally, the cladding layer 220 may include a second metal (e.g., gold or the like). In some examples, the cladding layer 220 includes a third metal (e.g., silver or the like), and the third metal may be alloyed with the second metal. The cladding layer 220 may be coupled around a perimeter of the core 210. For example, the cladding layer 220 may enclose (e.g., surround, cover, or the like) the core 210.

Figure 3:
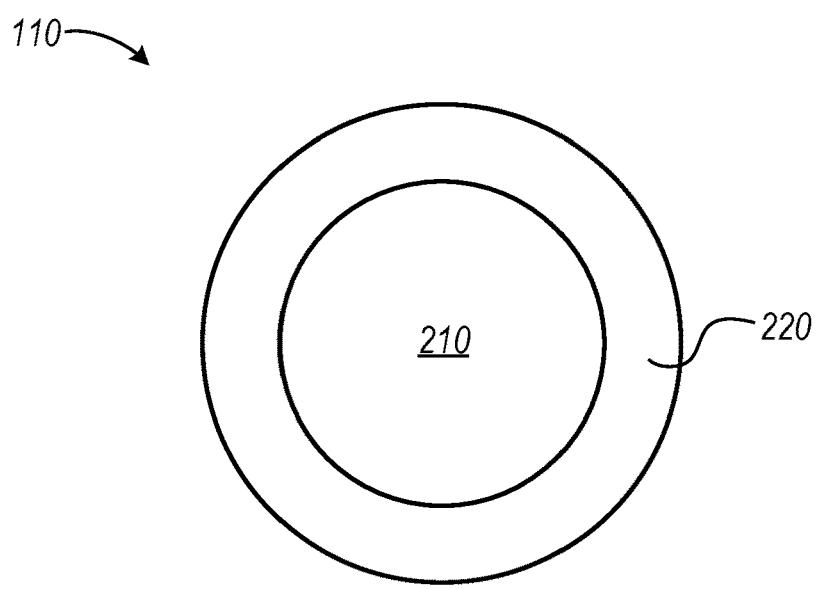
FIG. 3 is a schematic end view of the probe head of FIG. 2.

FIG. 3 is a schematic end view of the probe head of FIG. 2. As shown in FIG. 3, the cladding layer 220 may be coupled around a perimeter of the core 210. The core 210 and the cladding layer 220 may be included in a wire (e.g., a continuous length of material), and a segment of the wire may be cut from the remaining portions of the wire to provide the probe head 110.

The probe head 110 may have a variety of profiles. As shown in FIG. 3, the probe head 110 may have a circular profile. In some examples, the cladding layer 220 may be coupled concentrically with the core 210. In another example, the probe head 110 may have a rectangular profile. In yet another example, the probe head 110 may have an oval profile. In still yet another example, the probe head 110 may have a combination of profiles (e.g., a portion of the probe head 110 is circular, and a different portion of the probe head 110 is oval). Additionally, the probe head 110 may include an irregular profile (e.g., a U-shaped profile, a star-shaped profile, or the like).

Figure 4:
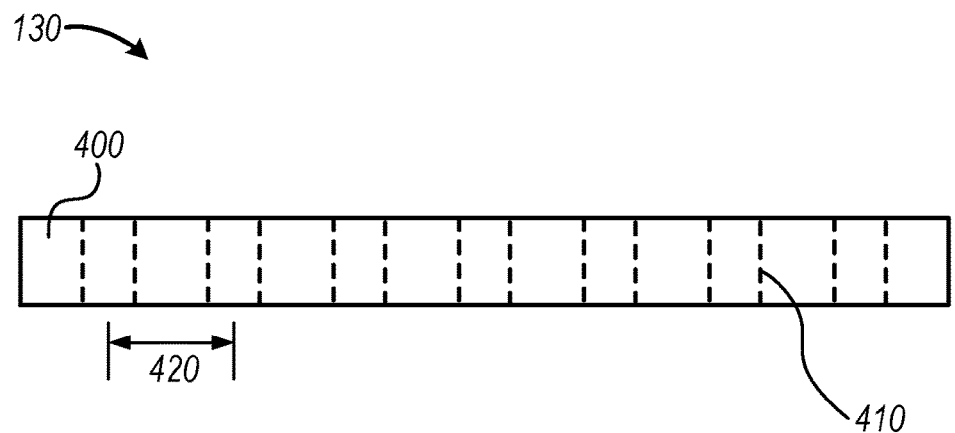
FIG. 4 is a schematic side view of a probe holder.

FIG. 4 is a schematic side view of the probe holder 130. The probe holder 130 may include a body 400 and the body 400 may define one or more sockets 410. The sockets 410 may be sized and shaped to receive the probe head 100. Additionally, the sockets 410 may be arranged in an array, and the sockets may be spaced apart, for instance at a first pitch 420. In an example, the sockets 410 may receive individual probe heads 115, and the probe holder 130 may hold the probe heads 115 (e.g., provide mechanical support to the probe heads 115). Additionally, the probe holder 130 may space the probe heads 115 apart at the first pitch 420.

Figure 5:
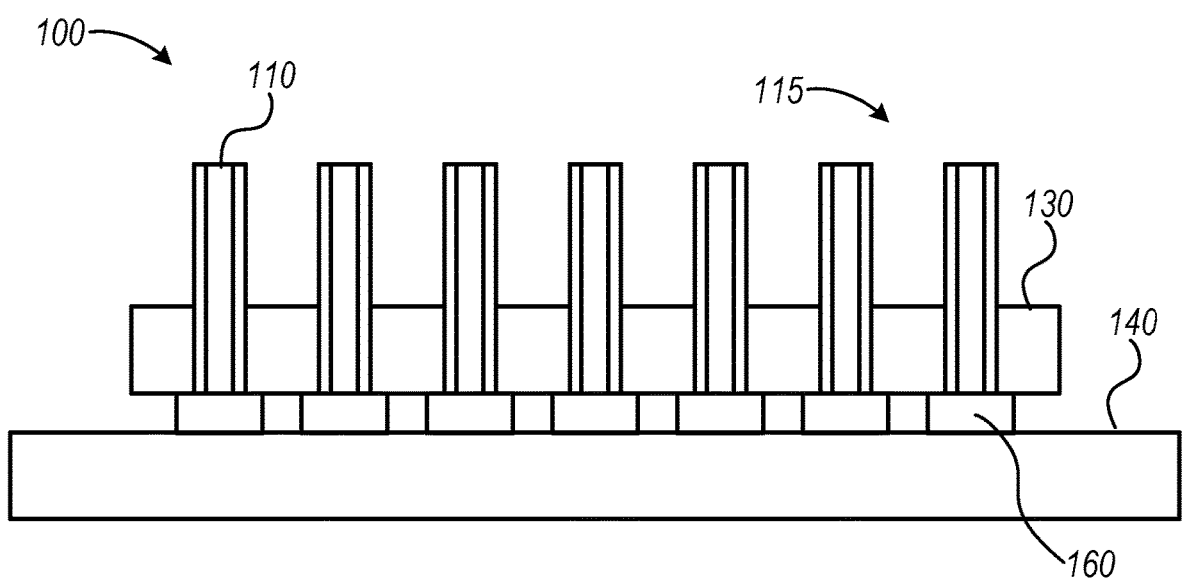
FIG. 5 is another schematic side view of the system for testing electronic devices of FIG. 1.

FIG. 5 is another schematic side view of the system 100 for testing electronic devices of FIG. 1. As described herein, the probe heads 110 may be received by the probe holder 130, and the probe heads 115 may be coupled to the substrate 140, for instance with the solder balls 160. As described in greater detail herein, one or more manufacturing operations may be performed with the probe heads 115 (e.g., the probe head 110) in-situ (e.g., with the probe heads 115 received by the probe holder 130, or with the probe heads 115 coupled to the substrate 140). Performing manufacturing operations on the probe heads 115 in-situ may decrease the formation of defects in the system 100. For instance, and in some examples, the probe head 110 may be damaged when assembled together with the system 130 (e.g., locating the probe head 110 in the probe holder 130, or coupling the probe head 110 to the substrate 140). Accordingly, the damage to the probe head 110 may reduce manufacturing yields for the system 100, increase the cost associated with manufacturing the system 100, and/or increase the cost associated with manufacturing and testing electronic devices (e.g., a semiconductor die).

Figure 6:
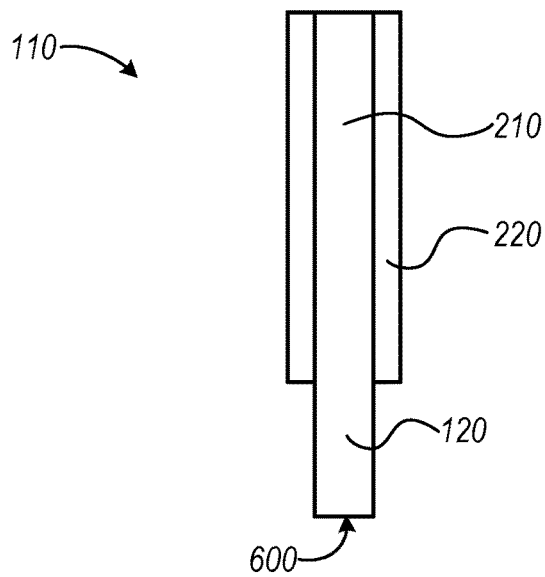
FIG. 6 is a schematic side view of the probe head during another manufacturing operation.

FIG. 6 is a schematic side view of the probe head 110 during another manufacturing operation. As described herein, at least one manufacturing operations may be performed on the probe head 110, for instance with the probe head 110 in-situ within the system 100. In an example, a portion of the cladding layer 220 may be removed from the core 210, and the removal of the cladding layer 220 may expose a portion of the core 210. For instance, a portion of the cladding layer 220 may be etched away to remove the portion of the cladding layer 220 from the probe head 110. In some examples, a first solvent may be used to etch the cladding layer 220 (e.g., the first section 760 and the second section 770 of the cladding layer 220, shown in FIG. 7). The first solvent may include, but is not limited to solutions including potassium and iodine (e.g., potassium iodide) or the like may be used to etch the cladding layer 220. Optionally, the first solvent may etch the cladding layer 220 without etching the core 210 (e.g., the first solvent does not react with the core 210 to remove portions of the cladding layer 220).

The removal of the cladding layer 220 may define the probe tip 120. The probe tip 120 may have a probe tip surface 600, and in some examples, the probe tip surface 600 may be engaged with an electronic device (e.g., a copper pillar coupled to a semiconductor die) to transmit (or receive) an electrical signal to (or from) the electronic device. The probe tip 120 may extend beyond an end of the cladding layer 220. For instance, the probe tip 120 may extend beyond the cladding layer 220 along the probe axis 230 (shown in FIG. 2). Accordingly, the probe tip 120 may extend from the probe head 110, for instance the probe tip 120 may extend along the probe axis 230 (shown in FIG. 2).

Figure 7:
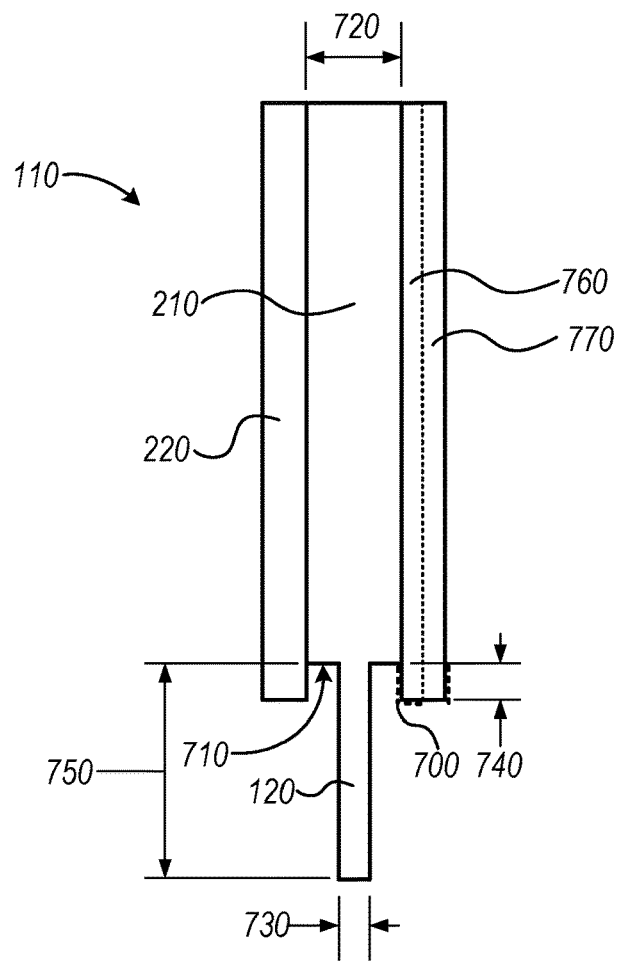
FIG. 7 is a schematic side view of the probe head during yet another manufacturing operation.

FIG. 7 is a schematic side view of the probe head 110 during yet another manufacturing operation. As described herein, at least one manufacturing operations may be performed on the probe head 110, for instance with the probe head 110 in-situ within the system 100. In an example, a portion of the core 210 may be removed, for example to shape the profile of the probe tip 120. For instance, a portion of the core 110 may be etched away to remove the portion of the core 210 from the probe head 110.

In some examples, a second solvent (e.g., potassium ferricyanide, potassium hydroxide, potassium phosphate, or the like) without etching the cladding layer 220 (e.g., the second solvent does not react with the cladding layer 220 to remove portions of the core 210). Additionally, the second solvent may react with the cladding layer 220 without etching cladding layer 220. In an example, the second solvent may react with the cladding layer 220 to provide a crown layer 700 that protects a portion of (or all of) the cladding layer 220, and accordingly the crown layer 700 may inhibit etching of the cladding layer 220. In some examples, the crown layer 700 may be coupled to the cladding layer 220, for instance a first section 760 of the cladding layer 220 or a second section 770 of the cladding layer 220. The first section 760 of the cladding layer 220 may include a first metal material (e.g., silver). The second section 770 of the cladding layer 220 may include a second metal material (e.g., gold). The second solvent may react with the first section 760 to provide the crown layer 700. The second solvent may react with the second section 770 to provide the crown layer 700. The second solvent may react with both the first section 760 and the second section 770 to provide the crown layer 700.

The crown layer 700 may include phosphorous. The crown layer 700 may be detectable by observing the probe head 110. For example, the probe head 110 may be observed with energy dispersive spectroscopy, x-ray fluorescence, electron energy loss spectroscopy, or the like. The observing of the probe head 100 may detect a layer of phosphorous coupled to the cladding layer 220, and the detection of phosphorous may indicate the presence of the crown layer 700.

Referring again to FIG. 7, the core 210 of the probe head 110 may include a core surface 710, and the core surface 710 may have a core surface dimension 720. The probe tip 120 may extend from the core surface 710, and the probe tip 120 may have a first tip dimension 730. The core surface dimension 720 may be greater than the first tip dimension 730 (e.g., a thickness of the core surface 710 may greater than a thickness of the probe tip 120). For instance, the first tip dimension 730 may be within a range of approximately 8 micrometers to 18 micrometers (e.g., 10 micrometers to 15 micrometers, 11 micrometers to 12 micrometers, or the like). The core surface dimension 720 may be within a range of approximately 20 micrometers to 50 micrometers (e.g., 35 micrometers to 42 micrometers, 22 micrometers to 25 micrometers, or the like). Additionally, the core surface dimension 720 and the first tip dimension 730 may be perpendicular to the probe axis 230 (shown in FIG. 2).

Further, the cladding layer 220 may extend beyond the core surface 710, for example by a cladding projection dimension 740. In an example, the core 210 may be isotropically etched by the second etchant. As described herein, the etching of the core 210 by the second etchant may etch the core 210 without etching the cladding layer 220 (e.g., because of chemical selectivity or the crown layer 700). The etching of the core 210 may remove the core 210 so that the cladding layer 220 extends beyond the core surface 710 (e.g., the core surface 710 may be recessed within the cladding layer 220). The crown layer 700 may be coupled to the cladding layer 220 in a region proximate to where the cladding layer 220 extends beyond the core surface 710.

Still further, the cladding projection dimension 740 may be parallel to the probe axis 230 (shown in FIG. 2). As described herein, the probe tip 120 may extend from the core surface 710. For instance, the probe tip 120 may have a second tip dimension 750. As shown in FIG. 7, the second tip dimension 750 may be greater than the cladding projection dimension 740.

Figure 8:
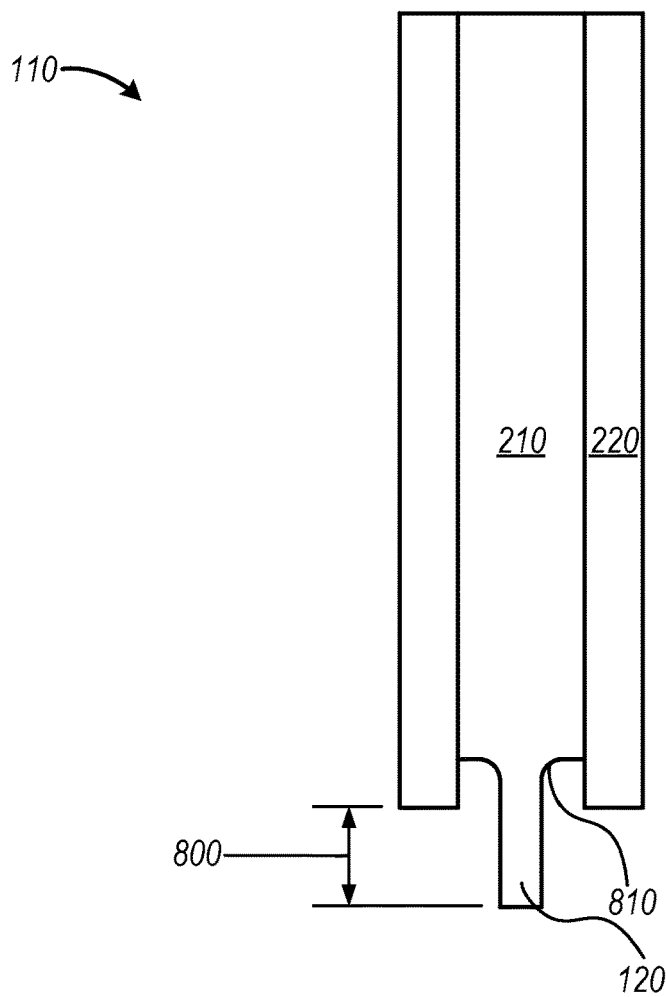
FIG. 8 is a schematic side view of the probe head during still yet another manufacturing operation.

FIG. 8 is a schematic side view of the probe head 110 during still yet another manufacturing operation. As described herein, the probe tip 120 may extend from the core surface 710 (shown in FIG. 7), and the cladding layer 220 may extend beyond the core surface 710. Additionally, the second tip dimension 750 may be greater than the cladding projection dimension 740. For example, the probe tip 120 may extend beyond the cladding layer 220 by a tip protrusion dimension 800.

In some examples, the probe tip 120 may be planarized, for instance to reduce the tip protrusion dimension 800 (or the second tip dimension 750, shown in FIG. 7). For instance, the probe tip surface 600 (shown in FIG. 6) may be planarized to reduce surface variations (e.g., roughness, undulations, or the like) on the probe tip surface 600. In an example, probe tip surface 600 may be engaged with a planarizing surface (e.g., a moving surface that includes a silica grit, or the like), and the probe tip surface 600 may be planarized (e.g., ground, sanded, smoothed, flattened, or the like). Planarizing the probe tip 120 may improve the performance of the probe tip 120, for instance, the planarizing the probe tip 120 may improve the durability of the probe tip 120 (e.g., planarizing the probe tip 120 may help maintain the geometry of the probe tip 120 during use of the probe tip 120).

Additionally, the probe head 110 may include a probe neck 810. The probe neck 810 may offset the probe tip 120 from the perimeter of the core 210 (e.g., the probe neck 810 may offset the probe tip 120 from an interface of the core 210 and the cladding layer 220). Further, the probe neck 810 may provide a transition from the probe surface 710 (shown in FIG. 7) to the probe tip 120. Additionally, and as shown in FIG. 8, the probe neck 810 may be rounded. In some examples, etching the core 210 with the second solvent may round the probe neck 810. The probe tip 120 may be rounded (e.g., if the probe tip 120 is not planarized).

Figure 9:
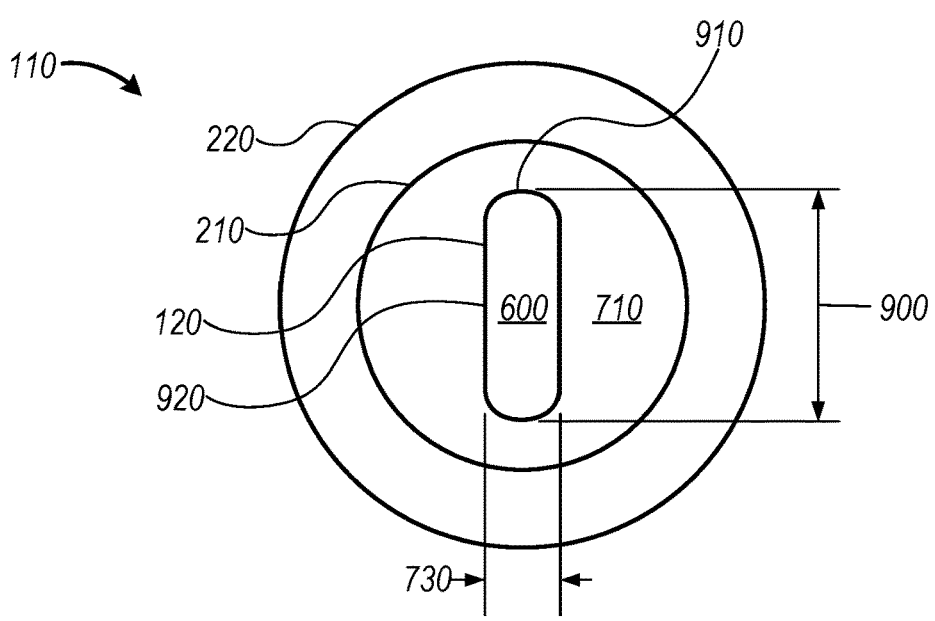
FIG. 9 is a schematic end view of the probe head shown in FIG. 8.

FIG. 9 is a schematic end view of the probe head 110 shown in FIG. 8. The core 210 may be arranged to be concentric with the cladding layer 220. Additionally, the probe tip surface 600 may be parallel with the core surface 710 (see also FIGS. 6-7). In another example, the probe tip surface 600 is angled with respect to the core surface 710.

As described herein, the probe head 110 may have a variety of profiles. In an example, the cladding layer 220 may have a circular profile. In another example, the probe tip 120 may have an ellipsoid-shaped profile. An end 910 of the probe tip 120 may be rounded, and a side 920 of the probe tip 120 may be linear. Additionally, the first tip dimension 730 may be less than a third tip dimension 900. In an example, the third tip dimension may be within a range of approximately 20 micrometers to 50 micrometers (e.g., 35 micrometers to 42 micrometers, 22 micrometers to 25 micrometers, or the like).

Figure 10:
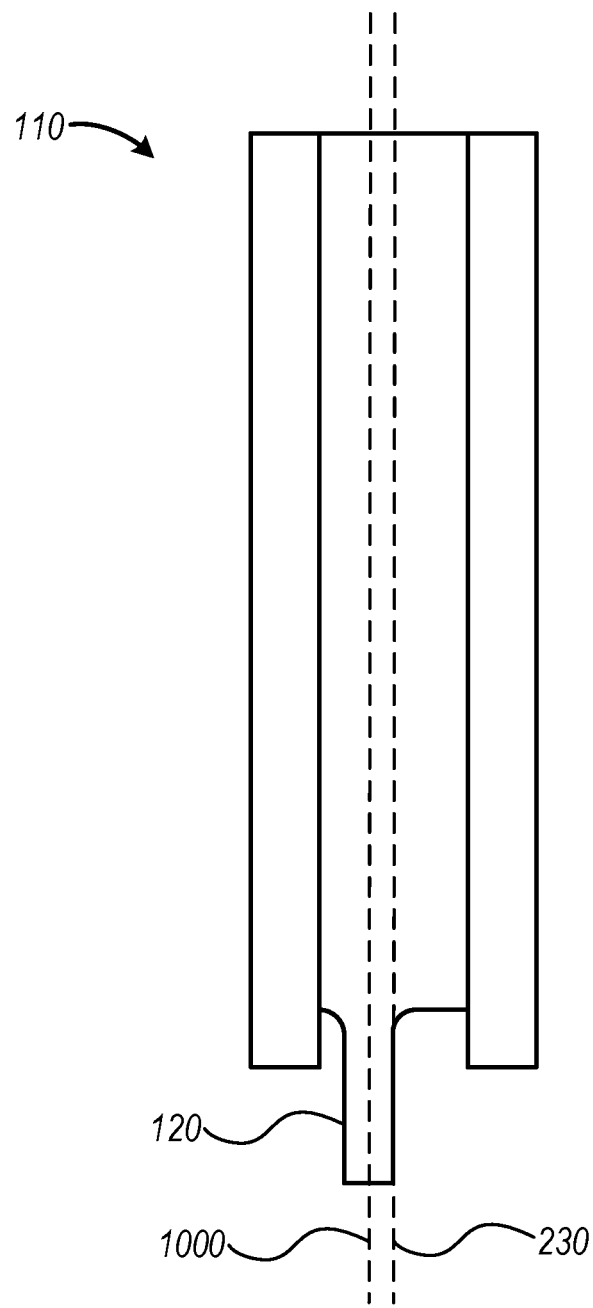
FIG. 10 is a schematic side view of the probe head with an offset probe tip.

FIG. 10 is a schematic side view of the probe head 110 with an offset probe tip 120. In some examples, a tip axis 1000 may be offset from the probe axis 230 (e.g., the tip axis 1000 and the probe axis 1000 are not collinear). For instance, the tip axis 1000 may be spaced from the probe axis 230 by an offset dimension 1010.

FIG. 11 shows one example of a method 1100 for manufacturing an electronic device testing system, including one or more of system 100 or the probe head 100 described herein. In describing the method 1100, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 1100 include, but are not limited to, the corresponding numbered elements provided herein and other corresponding elements described herein (both numbered and unnumbered) as well as their equivalents.

The method 1100 may include at 1110 that a cladding layer 220 of a probe head 110 may be etched, for instance with a first etchant. Etching the cladding layer 220 may remove a portion of the cladding layer 22 from a core 210 of the probe head 110. The cladding layer 220 may include a first metal. At 1120, the core 210 may be etched, for instance with a second etchant. Etching the core 210 may remove a portion of the core 210. The core 210 may include a second metal. The cladding layer 210 may extend beyond a core surface 710 of the core 210.

Several options for the method 1100 follow. In an example, a portion of the core 210, for example the probe tip 120, may be planarized. In another example, a plurality of probe heads 115 may be coupled to contacts 150 of a substrate 140. The substrate 140 may be configured to transmit an electrical signal to the probe heads 115. In yet another example, the probe head 110 may be compressed (e.g., plastically deformed) to change a cross-section of the probe head 110. For instance, the probe head 110 may be compressed to provide an ellipsoid-shaped profile to the probe head 110 (or the probe tip 120). In still yet another example, a wire (e.g., a section of wire) may be cut to provide the probe head 110. The wire may include the cladding layer 220, and the cladding layer 220 may be coupled around a perimeter of the probe core 210.

Various Notes & Aspects

Aspect 1 may include or use subject matter (such as an apparatus, a system, a device, a method, a means for performing acts, or a device readable medium including instructions that, when performed by the device, may cause the device to perform acts), such as may include or use a probe head for testing electronic devices, comprising: a probe axis extending along a length of the probe head; a probe core including a first metal, the probe core including: a core surface having a first dimension, wherein the first dimension is perpendicular to the probe axis; a probe tip extending from the core surface along the probe axis, wherein: the probe tip has a second dimension that is perpendicular to the probe axis; and the second dimension is less than the first dimension of the core surface; a cladding layer including a second metal, wherein the cladding layer is coupled around a perimeter of the probe core; and wherein the probe tip extends beyond the cladding layer.

Aspect 2 may include or use, or may optionally be combined with the subject matter of Aspect 1, to optionally include or use wherein the cladding layer extends beyond the core surface.

Aspect 3 may include or use, or may optionally be combined with the subject matter of one or any combination of Aspects 1 or 2 to optionally include or use wherein the probe core includes a probe neck that offsets the probe tip from the perimeter of the probe core.

Aspect 4 may include or use, or may optionally be combined with the subject matter of Aspect 3 to optionally include or use wherein the probe neck is rounded.

Aspect 5 may include or use, or may optionally be combined with the subject matter of one or any combination of Aspects 1 through 4 to optionally include or use wherein the second dimension is within a range of approximately 8 micrometers to 18 micrometers.

Aspect 6 may include or use, or may optionally be combined with the subject matter of one or any combination of Aspects 1 through 5 to optionally include or use wherein the first metal includes tungsten.

Aspect 7 may include or use, or may optionally be combined with the subject matter of one or any combination of Aspects 1 through 6 to optionally include or use wherein the cladding layer includes a third metal and the second metal is alloyed with the third metal.

Aspect 8 may include or use, or may optionally be combined with the subject matter of Aspect 7 to optionally include or use wherein the second metal includes gold and the third metal includes silver.

Aspect 9 may include or use, or may optionally be combined with the subject matter of one or any combination of Aspects 1 through 8 to optionally include or use wherein the probe tip includes a planar tip surface substantially parallel with the core surface.

Aspect 10 may include or use, or may optionally be combined with the subject matter of one or any combination of Aspects 1 through 9 to optionally include or use a crown layer coupled with the cladding layer, wherein the crown layer includes phosphorous.

Aspect 11 may include or use subject matter (such as an apparatus, a system, a device, a method, a means for performing acts, or a device readable medium including instructions that, when performed by the device, may cause the device to perform acts), such as may include or use a system for testing electronic devices, comprising: one or more probe heads, including: a probe axis extending along a length of the probe head; a probe core including a first metal, the probe core including: a core surface having a first dimension, wherein the first dimension is perpendicular to the probe axis; a probe tip extending from the core surface along the probe axis, wherein: the probe tip has a second dimension that is perpendicular to the probe axis; and the second dimension is less than the first dimension of the core surface; a cladding layer including a second metal, wherein the cladding layer is coupled around a perimeter of the probe core; and wherein the probe tip extends beyond the cladding layer; a probe holder including one or more probe sockets, wherein the probe sockets are configured to receive the one or more probe heads; a substrate including one or more contacts configured to engage with the one or more probe heads, wherein the one or more contacts transmit an electrical signal between the substrate and the one or more probe heads.

Aspect 12 may include or use, or may optionally be combined with the subject matter of Aspect 11, to optionally include or use a signal generator in communication with the substrate, wherein the signal generator is configured to produce the electrical signal.

Aspect 13 may include or use, or may optionally be combined with the subject matter of one or any combination of Aspects 11 or 12 to optionally include or use wherein the one or more probe heads are each respectively coupled to the one or contacts with solder.

Aspect 14 may include or use, or may optionally be combined with the subject matter of one or any combination of Aspects 11 through 13 to optionally include or use wherein the probe holder includes a ceramic material.

Aspect 15 may include or use, or may optionally be combined with the subject matter of one or any combination of Aspects 11 through 14 to optionally include or use wherein the one or more probe heads are arranged in an array.

Aspect 16 may include or use subject matter (such as an apparatus, a system, a device, a method, a means for performing acts, or a device readable medium including instructions that, when performed by the device, may cause the device to perform acts), such as may include or use a method for manufacturing an electronic device testing system, comprising: etching a cladding layer of a probe head with a first etchant to remove a portion of the cladding layer from a probe core of the probe head, wherein the cladding layer includes a first metal; etching the probe core with a second etchant to remove a portion of the probe core, wherein the probe core includes a second metal; and wherein the cladding layer extends beyond a probe core surface of the probe core.

Aspect 17 may include or use, or may optionally be combined with the subject matter of Aspect 16, to optionally include or use planarizing a portion of the probe core.

Aspect 18 may include or use, or may optionally be combined with the subject matter of one or any combination of Aspects 16 or 17 to optionally include or use wherein the probe head is included in a plurality of probe heads, and further comprising coupling the plurality of probe heads with one or more contacts of a substrate, and wherein the substrate is configured to transmit an electrical signal to the one or more probe heads.

Aspect 19 may include or use, or may optionally be combined with the subject matter of one or any combination of Aspects 16 through 18 to optionally include or use compressing the probe head to change a cross section of the probe head.

Aspect 20 may include or use, or may optionally be combined with the subject matter of one or any combination of Aspects 16 through 19 to optionally include or use cutting a wire to provide the probe head, wherein the wire includes the cladding layer is coupled around a perimeter of the probe core.

Aspect 21 may include or use, or may optionally be combined with any portion or combination of any portions of any one or more of Aspects 1 through 20 to include or use, subject matter that may include means for performing any one or more of the functions of Aspects 1 through 20.

Each of these non-limiting aspects may stand on its own, or may be combined in various permutations or combinations with one or more of the other aspects.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A probe head for testing electronic devices, comprising:
a probe axis extending along a length of the probe head;
a probe core including a first metal, the probe core including:
  a core surface having a first dimension, wherein the first dimension is perpendicular to the probe axis;
  a probe tip extending from the core surface along the probe axis, wherein:
    the probe tip has a second dimension that is perpendicular to the probe axis; and
    the second dimension is less than the first dimension of the core surface;
a cladding layer including a second metal, wherein the cladding layer is coupled around a perimeter of the probe core; and
wherein the probe tip extends beyond the cladding layer, and the cladding layer extends beyond the core surface.

2. The probe head of claim 1, wherein the probe core includes a probe neck, and the cladding layer at least partially surrounds the probe neck.

3. The probe head of claim 1, wherein the probe core includes a probe neck that offsets the probe tip from the perimeter of the probe core.

4. The probe head of claim 3, wherein the probe neck is rounded.

5. The probe head of claim 1, wherein the second dimension is within a range of approximately 8 micrometers to 18 micrometers.

6. The probe head of claim 1, wherein the first metal includes tungsten.

7. The probe head of claim 1, wherein the cladding layer includes a third metal and the second metal is alloyed with the third metal.

8. The probe head of claim 7, wherein the second metal includes gold and the third metal includes silver.

9. The probe head of claim 1, wherein the probe tip includes a planar tip surface substantially parallel with the core surface.

10. The probe head of claim 1, further comprising a crown layer coupled with the cladding layer, wherein the crown layer includes phosphorous.

11. A system for testing electronic devices, comprising:
one or more probe heads, including:
  a probe axis extending along a length of the probe head;
  a probe core including a first metal, the probe core including:
    a core surface having a first dimension, wherein the first dimension is perpendicular to the probe axis;
    a probe tip extending from the core surface along the probe axis, wherein:
      the probe tip has a second dimension that is perpendicular to the probe axis; and
      the second dimension is less than the first dimension of the core surface;
    a cladding layer including a second metal, wherein the cladding layer is coupled around a perimeter of the probe core; and
    wherein the probe tip extends beyond the cladding layer, and the cladding layer extends beyond the core surface;
a probe holder including one or more probe sockets, wherein the probe sockets are configured to receive the one or more probe heads; and
a substrate including one or more contacts configured to engage with the one or more probe heads, wherein the one or more contacts transmit an electrical signal between the substrate and the one or more probe heads.

12. The system of claim 11, further comprising a signal generator in communication with the substrate, wherein the signal generator is configured to produce the electrical signal.

13. The system of claim 11, wherein the one or more probe heads are each respectively coupled to the one or contacts with solder.

14. The system of claim 11, wherein the probe holder includes a ceramic material.

15. The system of claim 11, wherein the one or more probe heads are arranged in an array.

16. A method for manufacturing an electronic device testing system, comprising:
etching a cladding layer of a probe head with a first etchant to remove a portion of the cladding layer from a probe core of the probe head, wherein the cladding layer includes a first metal;
etching the probe core with a second etchant to remove a portion of the probe core, wherein the probe core includes a second metal; and
wherein the cladding layer extends beyond a probe core surface of the probe core, and the cladding layer extends beyond the core surface.

17. The method of claim 16, further comprising planarizing a portion of the probe core.

18. The method of claim 16, wherein the probe head is included in a plurality of probe heads, and further comprising coupling the plurality of probe heads with one or more contacts of a substrate, and wherein the substrate is configured to transmit an electrical signal to the one or more probe heads.

19. The method of claim 16, further comprising compressing the probe head to change a cross section of the probe head.

20. The method of claim 16, further comprising cutting a wire to provide the probe head, wherein the wire includes the cladding layer is coupled around a perimeter of the probe core.

* * * * *